(12) United States Patent
Akagi et al.

(10) Patent No.: US 8,022,477 B2
(45) Date of Patent: Sep. 20, 2011

(54) SEMICONDUCTOR APPARATUS HAVING LATERAL TYPE MIS TRANSISTOR

(75) Inventors: Nozomu Akagi, Nukata-gun (JP); Shigeki Takahashi, Okazaki (JP); Takashi Nakano, Nukata-gun (JP); Yasushi Higuchi, Okazaki (JP); Tetsuo Fujii, Toyohashi (JP); Yoshiyuki Hattori, Aichi-gun (JP); Makoto Kuwahara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 668 days.

(21) Appl. No.: 12/071,411

(22) Filed: Feb. 21, 2008

(65) Prior Publication Data

US 2008/0230834 A1    Sep. 25, 2008

(30) Foreign Application Priority Data

Mar. 20, 2007 (JP) ................................. 2007-073320

(51) Int. Cl.
*H01L 29/66* (2006.01)

(52) U.S. Cl. ........ 257/343; 257/335; 257/342; 257/346; 257/E29.261; 257/E27.023; 438/282; 438/299

(58) Field of Classification Search .......... 257/342–346, 257/377–380, 22, 369, 324, E29.261, E27.023, 257/E27.43, E27.024, E29.031, E21.373, 257/E27.025, E29.119, E21.424, E27.032, 257/E29.12, E21.435, E27.033, E29.152, 257/E27.035, E21.569, E21.219, E21.338, 257/E21.215, E21.567, 335, 336, 341, 363, 257/392, 358–360, E27.043; 438/282, 299

See application file for complete search history.

(56) References Cited

U.S. PATENT DOCUMENTS

| | | | | |
|---|---|---|---|---|
| 3,999,210 | A | * | 12/1976 | Yamada ........................ 257/364 |
| 5,227,655 | A | | 7/1993 | Kayama |
| 5,304,802 | A | * | 4/1994 | Kumagai ...................... 257/328 |
| 5,466,963 | A | | 11/1995 | Beasom |
| 6,057,577 | A | * | 5/2000 | Barret et al. .................. 257/355 |
| 6,348,716 | B1 | * | 2/2002 | Yun .............................. 257/356 |
| 6,465,839 | B2 | | 10/2002 | Takahashi et al. |
| 6,614,077 | B2 | * | 9/2003 | Nakamura et al. ............ 257/355 |
| 6,700,156 | B2 | | 3/2004 | Saitoh et al. |

(Continued)

FOREIGN PATENT DOCUMENTS

JP   A-2001-352707   12/2001

(Continued)

OTHER PUBLICATIONS

Office Action issued on Mar. 5, 2010 by the German Patent Office in corresponding German Application No. 10 2008 014 338.3-33 (English translation enclosed).

*Primary Examiner* — Cuong Q Nguyen
*Assistant Examiner* — Yosef Gebreyesus
(74) *Attorney, Agent, or Firm* — Posz Law Group, PLC

(57) ABSTRACT

A semiconductor apparatus comprises: a semiconductor substrate; and a lateral type MIS transistor disposed on a surface part of the semiconductor substrate. The lateral type MIS transistor includes: a line coupled with a gate of the lateral type MIS transistor; a polycrystalline silicon resistor that is provided in the line, and that has a conductivity type opposite to a drain of the lateral type MIS transistor; and an insulating layer through which a drain voltage of the lateral type MIS transistor is applied to the polycrystalline silicon resistor.

15 Claims, 9 Drawing Sheets

U.S. PATENT DOCUMENTS

| | | | |
|---|---|---|---|
| 6,911,696 B2 * | 6/2005 | Denison | 257/343 |
| 2001/0025987 A1 * | 10/2001 | Akaishi et al. | 257/343 |
| 2003/0047782 A1 * | 3/2003 | Hasegawa et al. | 257/347 |
| 2003/0209741 A1 | 11/2003 | Saitoh et al. | |
| 2005/0224909 A1 * | 10/2005 | Yamaguchi et al. | 257/528 |
| 2006/0087370 A1 * | 4/2006 | Tsuruhara et al. | 330/86 |
| 2008/0012610 A1 | 1/2008 | Aoki et al. | |

FOREIGN PATENT DOCUMENTS

| | | |
|---|---|---|
| JP | A-2005-192394 | 7/2005 |
| JP | A-2005-311052 | 11/2005 |

* cited by examiner

US 8,022,477 B2

SEMICONDUCTOR APPARATUS HAVING LATERAL TYPE MIS TRANSISTOR

CROSS REFERENCE TO RELATED APPLICATION

The present application is based on Japanese Patent Application No. 2007-73320 filed on Mar. 20, 2007, the disclosure of which is incorporated herein by reference.

FIELD OF THE INVENTION

The present invention relates to a semiconductor apparatus having a lateral type MIS (Metal Insulator Semiconductor) transistor.

BACKGROUND OF THE INVENTION

Japanese Patent Application Publication 2001-352707 discloses a semiconductor apparatus in which an LDMOS (Lateral Diffused Metal Oxide Semiconductor) transistor element is formed on a surface part of a semiconductor substrate.

A semiconductor apparatus 80 disclosed in JP-A-2001-352707 is described below with reference to FIG. 11. The semiconductor apparatus 80 is formed with using a SOI (silicon on insulator) substrate that includes a P type silicon substrate 2, an insulating layer 3, an N type layer 1. In the semiconductor apparatus 80, an N type region 6 (i.e., a drift region 6) is disposed so that the drift region 6 surrounds an N+ type drain region 5. The N type region has higher concentration than the N type layer 1. Concentration in the drift region 6 becomes higher as closer to the N+ type drain region 5. A P+ type contact region 9 is adjacent to and adjoins an N+ type source region 8. The P+ type contact region 9 extends so as to cover a part of the bottom side of the N+ type source region 8. A LOCOS (Local Oxidation of Silicon) oxide layer 4 and a gate electrode 11 are shown in FIG. 11.

The semiconductor apparatus 80 shown in FIG. 11 includes an LDMOS transistor element. A source and a drain of the LDMOS transistor element are disposed in a surface layer of the N type layer 1. Carrier flow direction is lateral. Since the LDMOS transistor element is capable of being switched at higher speed compared to other switching elements, the LDMOS transistor element may be utilized in a switching circuit, a switching power supply unit and the like, in which a switching element is switched on and off at high speed.

Generally, such a switching circuit as a DC-DC converter and an inverter is operated at a higher operating frequency, and thus, required inductance and capacitance are small. In the above case, it may be possible to configure a smaller switching circuit in accordance with the required smaller inductance and capacitance. Therefore, a transistor having a high speed switching capability is desired, and the LDMOS transistor element may be suitable. However, in general, when a transistor (including the LDMOS transistor element) is switched at high speed, a rapid voltage change causes a drain voltage overshoot (i.e., surge voltage), and accordingly, strong noise (ringing) generation and switching loss are caused.

Japanese Patent Application Publication 2004-6598, corresponding to U.S. Pat. No. 6,700,156, discloses a semiconductor apparatus associated with a transistor element used for a switching circuit.

A semiconductor apparatus 90 disclosed in JP-A-2004-6598 is described below with reference to FIG. 12. The semiconductor apparatus 90 is a sort of a VDMOS (Vertical Diffused Metal Oxide Semiconductor) transistor element. A gate and a source of the device 90 are disposed in both sides of a semiconductor substrate, respectively. The carrier flow direction is vertical. The semiconductor apparatus 90 shown in FIG. 12 is characterized by a P type layer 14. The P type layer 14 is adjacent to a P type base layer 12, and includes low-concentrated P-conductivity-type impurities. A conductivity type of the P type layer 14 is opposite to that of a drain.

In the semiconductor apparatus 90 shown in FIG. 12, as a drain voltage is higher, a gate-to-drain capacitance increases due to existence of the P-type layer 14. As a result, a surge voltage generation in the drain is suppressed. The P-type layer effectively functions in the VDMOS structured semiconductor apparatus 90. However, when a layer like the P-type layer 14 is disposed in a LDMOS structured semiconductor device, it is difficult to design a LDMOS semiconductor device due to its large influence on a carrier channel. Moreover, in the semiconductor apparatus 90, a flow of carriers through the low-impurity concentration P-type layer 14 causes a larger on-state resistance. Furthermore, only the existence of the P-type layer 14 may not sufficiently increase the gate-to-drain capacitance, and may not sufficiently suppress the surge voltage generation.

SUMMARY OF THE INVENTION

In view of the above-described problem, it is an object of the present disclosure to provide a semiconductor apparatus having a lateral type MIS transistor.

According to a first aspect of the present invention, a semiconductor apparatus comprises: a semiconductor substrate; a lateral type MIS transistor that is disposed on a surface part of the semiconductor substrate; a first line for a gate drive signal, the first line being coupled with a gate of the lateral type MIS transistor; a polycrystalline silicon resistor that is provided in the first line, and that has a conductivity type opposite to a drain of the lateral type MIS transistor; and an insulating layer through which a drain voltage of the lateral type MIS transistor is applied to the polycrystalline silicon resistor.

According to the above semiconductor apparatus, when the drain voltage increases, a depletion layer in the polycrystalline silicon resistor is enlarged. A drain voltage overshoot is reduced. Increase in noise and switching loss is suppressed. Since the polycrystalline silicon resistor is made of polycrystalline silicon, a cost involved in the polycrystalline silicon resistor is low. Since the polycrystalline silicon resistor is capable of being formed in a variety of locations in the semiconductor apparatus, it is possible to reduce dimensions of the semiconductor apparatus.

According to a second aspect of the present invention, a semiconductor apparatus comprises: a semiconductor substrate that has a first conductivity type; and a lateral type MIS transistor that is disposed on a surface part of the semiconductor substrate. The lateral type MIS transistor includes: an insulating layer that is disposed on a surface of the semiconductor substrate; a drain region that has the first conductivity type, and that is disposed on the insulating layer so that the drain region is disposed in the semiconductor substrate; a drift region that has the first conductivity type, and that is disposed in the semiconductor substrate so that the drain region is disposed between the drift region and the insulating layer; a gate electrode that has the first conductivity type, and that is disposed on the insulating layer; a polycrystalline silicon resistor that has a second conductivity type, and that is disposed on the insulating layer so that the insulating layer is disposed between the polycrystalline silicon resistor and the drift region; and a source region that has the first conductivity type, and that is disposed on the insulating layer so that the source region is disposed in the semiconductor substrate; a contact region that has the second conductivity type, and that is disposed on the insulating layer and adjacent to the source region. The semiconductor apparatus further comprises: a first line that is coupled with the gate electrode; and a second line that couples the polycrystalline silicon resistor with the gate electrode. The first conductivity type is opposite to the second conductivity type. The polycrystalline silicon resistor has an impurity concentration approximately lower than $1\times10^{17}$ cm$^{-3}$. A drain voltage of the lateral type MIS transistor is configured to be applied to the polycrystalline silicon resistor through the insulating layer.

According to the above semiconductor apparatus, the semiconductor apparatus includes the lateral type MIS transistor. The source region and the drain region are disposed on the surface part of the semiconductor apparatus. Carries flow in the lateral direction. In the above semiconductor apparatus, the polycrystalline silicon resistor is provided in the first line. The drain voltage is applied to the polycrystalline silicon resistor via the insulating layer. The polycrystalline silicon resistor has the impurity concentration approximately lower than $1\times10^{17}$ cm$^{-3}$, and therefore, the polycrystalline silicon resistor functions as a MIS type transistor. Since a conductivity type of the polycrystalline silicon resistor is opposite to that of the drain region, a depletion layer in the polycrystalline silicon resistor expands when the drain voltage increases. Therefore, an overshoot of the drain voltage is reduced. In addition, noise generation and switching loss are suppressed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Japanese Patent Application No. 2006-204770 was filed, in which a drive circuit for driving a MOS transistor is shown.

Figure 13:
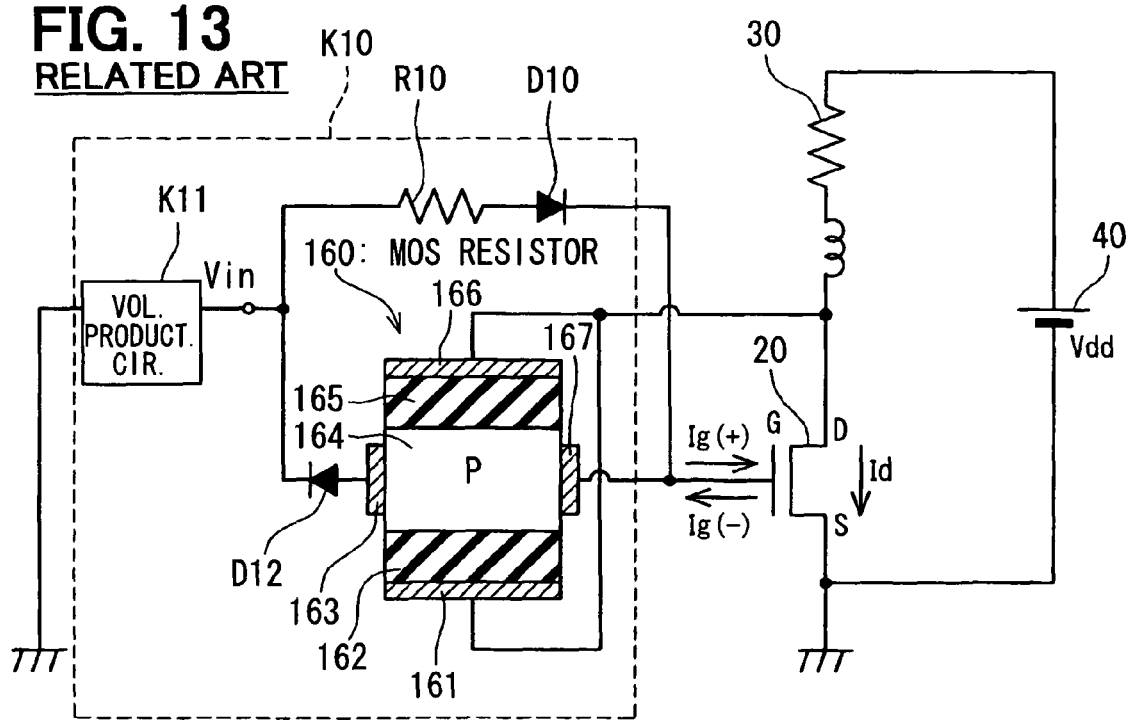
FIG. 13 is a circuit diagram of a switching circuit including a drive circuit utilizing a MOS transistor according to a related art.

A switching circuit shown in the above application is described below with reference to FIG. 13. The switching circuit includes a drive circuit for driving a MOS (metal-oxide-semiconductor) transistor as a lateral type MIS transistor. In FIG. 13, an area surrounded by a dash-line corresponds to a drive circuit K10 for driving a field-effect transistor 20 (i.e., an N type MOS). The drive circuit K10 for driving the transistor 20 includes a MOS resistor 160. The MOS resistor 160 provides a gate input resistance of the transistor 20.

In the switching circuit shown in FIG. 13, the transistor 20 is connected between a load 30 and ground. A parasitic inductance is connected between the transistor 20 and the load 30. The drive circuit K10 supplies a drive voltage Vin to a gate of the transistor 20, the drive voltage Vin including a rectangular wave. The drive circuit K10 switches on and off the transistor 20 based on the drive voltage Vin, and thereby, the drive circuit K10 switches on and off a DC (direct current) voltage Vdd supply from a power source 40 to the load 30.

The drive circuit K10 includes a drive voltage production circuit K11, a fixed resistor R10, a first diode D10, a second diode D12, the MOS resistor 160. The fixed resistor R10 and the first diode D10 are connected in series. The MOS resistor 160 and the second diode D12 are connected in series. One pair including the fixed resistor R10 and the first diode D10 and the other pair including the MOS resistor 160 and the second diode D12 are connected in parallel between the drive voltage production circuit K11 and the transistor 20. An anode of the first diode D10 is coupled with the drive voltage production circuit K11. A cathode of the first diode D10 is coupled with the transistor 20. An anode of the second diode D12 is coupled with the transistor 20. A cathode of the second diode D12 is coupled with the drive voltage production circuit K11.

The MOS resistor 160 includes a first insulator region 162, a P type semiconductor region 164 and a second insulator region 165. The first insulator region 162 and the second insulator region 165 are made of, for example, silicon oxide. The P type semiconductor region is made of monocrystalline silicon which includes P type impurities. The P type semiconductor region 164 separates the first insulator region 162 from the second insulator region 165. A first electrode 161 faces the P type semiconductor region 164 through the first insulator region 162. A second electrode 166 faces the P type semiconductor region 164 through the second insulator region 165. The first and second electrodes 161, 166 are electrically connected with a drain electrode D of the transistor 20. One end of the P type semiconductor region 164 is electrically connected with a gate electrode G of the transistor via a third electrode 167. The other end of the P type semiconductor region 164 is electrically connected with the drive voltage production circuit K11 via a fourth electrode 163. The MOS resistor 160 can control a width of a depletion layer, which expands and contracts in a P type semiconductor region by field-effect. A resistance R of the MOS resistor 160 increases almost continuously in accordance with an applied voltage V. When a voltage Vds between the drain and the source is small, the resistance R of the MOS resistor 160 is adjusted to a small value. When a voltage Vds between the drain and the source is large, the resistance R is adjusted to a large value. The resistance R of the MOS resistor 160, which corresponds to a gate input resistance, increases as the drain voltage is higher. In the above manner, switching speeds are high in an initial stage of switching. In a late stage of switching where the voltage overshoot poses a problem, the switching speed is caused to be smaller. The above configuration suppresses the generation of the surge voltage in the drain in the late stage of switching.

Example Embodiment

A semiconductor apparatus 100 is described below with reference to FIGS. 1-3. Note that, for the reason of simplification and easier understanding, a fixed resistor R10, a first diode D10 and a second diode D12, which are shown in FIG. 13, are omitted in FIG. 2.

Figure 1:
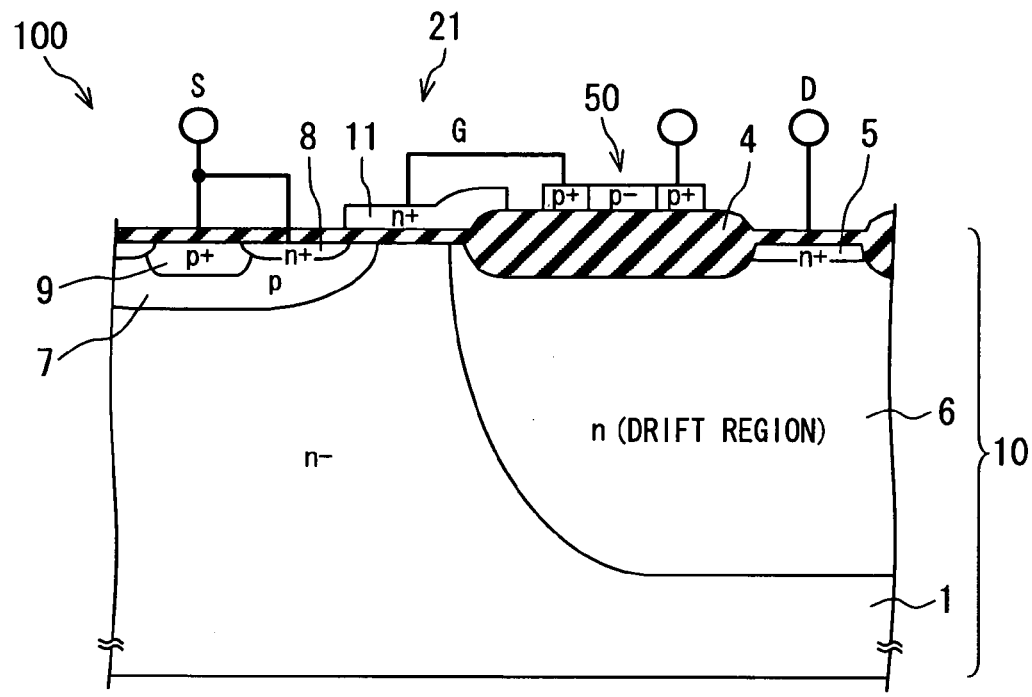
FIG. 1 is a schematic cross sectional view of a semiconductor apparatus according an example embodiment.
Figure 2:
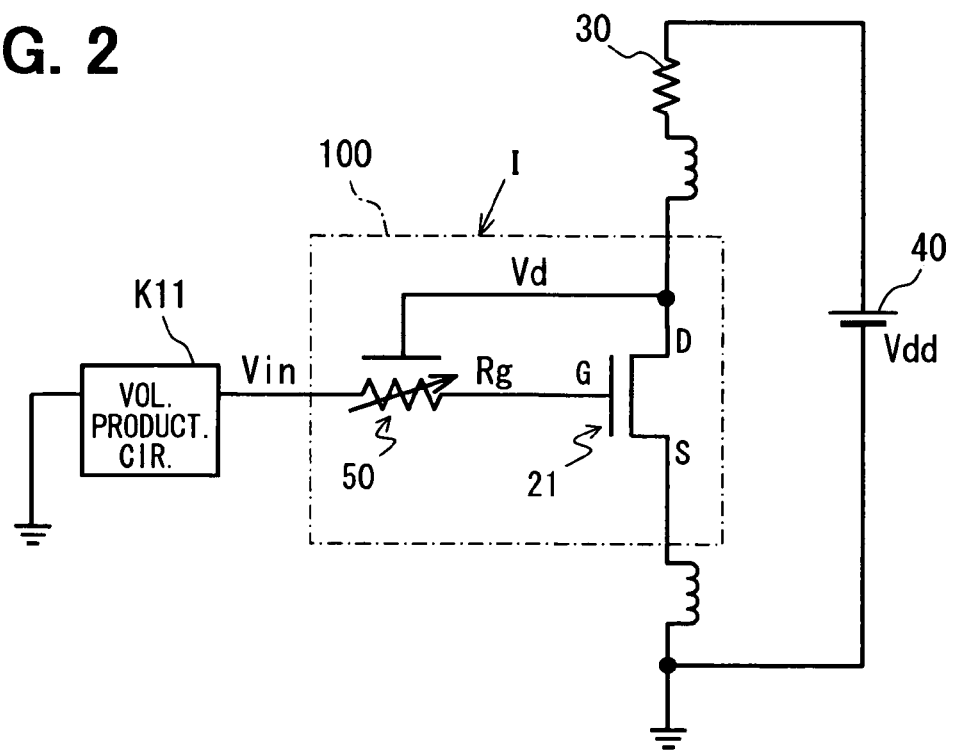
FIG. 2 is a circuit diagram of a switching circuit including an equivalent circuit of the semiconductor apparatus shown in FIG. 1, where an area I surrounded by a dashed-dot line shown in FIG. 2 corresponds to the semiconductor apparatus shown in FIG. 1.

As shown in FIG. 1, the semiconductor apparatus 100 includes a semiconductor substrate 10 and a lateral diffused metal oxide semiconductor (LDMOS) transistor 21 as a lateral type MIS transistor. The LDMOS transistor 21 is disposed in a surface part of the semiconductor substrate 10. As shown in FIGS. 1 and 2, a polycrystalline silicon resistor 50 is provided in a line for a gate drive signal of the LDMOS transistor 21. The polycrystalline silicon resistor 50 is a P type element which is opposite to a drain (N type) of the LDMOS transistor 21. The polycrystalline silicon resistor 50 is disposed on an insulating film which includes a LOCOS (Local Oxidation of Silicon) oxide layer 4. The LOCOS oxide layer 4 is formed and disposed on a drift region 6 of a drain (D) of the LDMOS 21. In the above configuration, a drain voltage Vd of the drift region 6 of the LDMOS 21 is applied to the polycrystalline silicon resistor 50 via the LOCOS oxide layer 4.

The semiconductor apparatus 100 includes the LDMOS transistor 21. A source (S) and the drain (D) are disposed in one surface part of the semiconductor substrate 10. The LDMOS 21 having lateral carrier flow with respect to the semiconductor substrate 10 can perform high-speed switching compared to other transistor elements. The LDMOS 21 is suitably used for a switching circuit, a switching power supply and the like.

Generally, as operating frequency of a switching circuit is changed to a larger value with using a high-speed transistor element such as the LDMOS 21, it is possible to reduce dimensions of the switching circuit. However, a voltage change at switching becomes large, and thus, the overshoot of the drain voltage becomes large (because of generation of a surge voltage and noise).

According to the semiconductor apparatus 100 shown in FIG. 1, the polycrystalline silicon resistor 50 as a gate input resistor Rg is provided in the line for the gate drive signal of the LDMOS transistor 21. The polycrystalline silicon resistor 50 is a P type element which is opposite to a drain (N type) of the LDMOS transistor 21. The drain voltage Vd is applied to the polycrystalline silicon resistor 50 via the insulating film having the LOCOS oxide layer 4. A potential of the voltage Vd is variable in switching. When an impurity concentration of the polycrystalline silicon resistor 50 is set to be lower than $1 \times 10^{17}$ cm$^{-3}$ (i.e., p−), the polycrystalline silicon resistor 50 functions as the MOS resistor shown in FIG. 13. Since the conductivity type of the polycrystalline silicon resistor 50 is opposite to that of the drain, when the LDMOS 21 is switched to an off state and the drain voltage Vd is increased, a depletion layer is spread and a resistance is increased. Therefore, the LDMOS 21 switches at high speed in an initial stage of the switching since a resistance of the polycrystalline silicon resistor 50 is small (i.e., a gate input resistance is small.). In a late stage of the switching, a switching speed of the LDMOS 21 decreases due to the increase in the resistance of the polycrystalline silicon resistor 50. The polycrystalline silicon resistor 50 reduces overshoot of the drain voltage Vd (i.e., surge voltage) and prevents the switching loss.

Figure 3A:
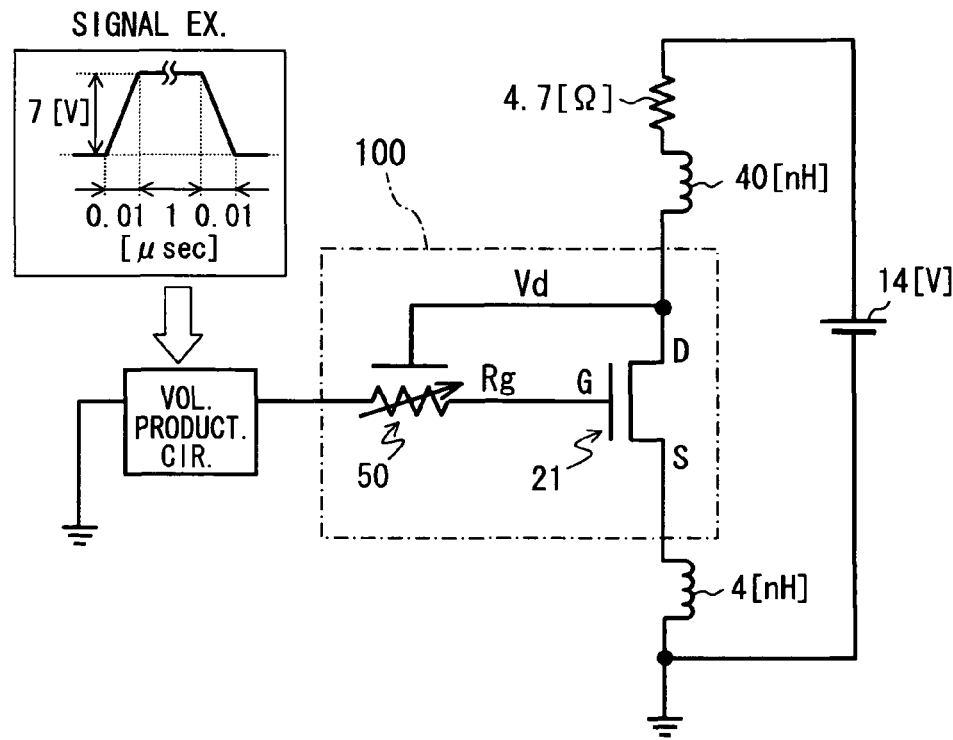
FIG. 3A is a circuit diagram for describing parameters used for a simulation.
Figure 3B:
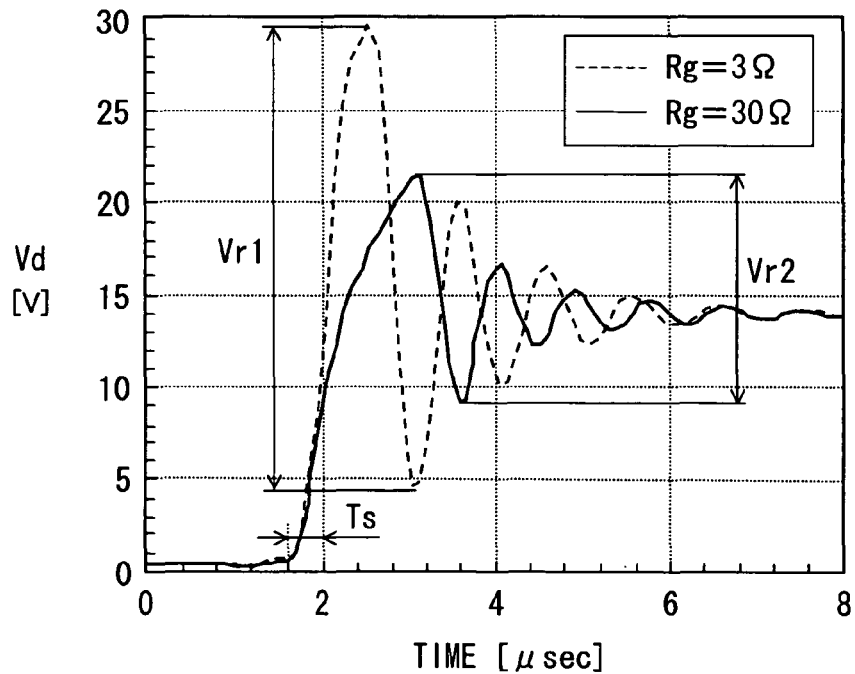
FIG. 3B is a graph showing a rate-of-rise characteristic of drain voltage Vd as a function of time, the drain voltage Vd being obtained from the simulation.

An effect of the polycrystalline silicon resistor 50 is evaluated by simulation. Results of the simulation are shown in FIG. 3B. FIG. 3A shows parameters on performing the simulation. FIG. 3B shows an initial rise characteristic of the drain voltage Vd in cases where the gate input resistances Rg are set to be 3Ω and 30Ω, respectively.

As shown in FIG. 3B, when the gate input resistance Rg is changed from 3Ω to 30Ω, a rate of rise of the drain voltage Vd is almost unchanged during a period Ts, and an amplitude of the drain voltage Vd associated with the overshoot and ringing is reduced from Vr1 to Vr2.

The polycrystalline silicon resistor 50 of the semiconductor apparatus 100 includes polycrystalline silicon and manufactured at a reasonably low cost. The polycrystalline silicon resistor 50 is capable of being formed at various region of the semiconductor substrate 10. Therefore, it is possible to reduce dimensions of the semiconductor apparatus 100 shown in FIG. 1 compared the following two cases. One case is that the MOS resistor 160 (made from monocrystalline silicon) shown in FIG. 13 is disposed in different location of a semiconductor substrate. The other case is that the MOS resistor 160 is disposed separately from a semiconductor substrate. The drain voltage Vd of the drift region is applied to the polycrystalline silicon resistor 50 via the LOCOS oxide layer 4. The LOCOS oxide layer 4 is disposed on the drift region 6 of the drain of the LDMOS 21. The conductivity type of the polycrystalline silicon resistor 50 is opposite to that of the drain. Since the polycrystalline silicon resistor 50 may not cause a chip area of the semiconductor apparatus 100 to increase, the semiconductor apparatus 100 may have a simple structure, and accordingly, it is possible to reduce dimensions of the semiconductor apparatus 100 and reduce a manufacturing cost.

The semiconductor apparatus 100 includes the LDMOS 21 capable of switching at high speed. In the semiconductor apparatus 100, the reducing of the overshoot of the drain voltage Vd suppresses the noise and switching loss. The semiconductor apparatus 100 may be small and may be manufactured at low cost.

Figure 4:
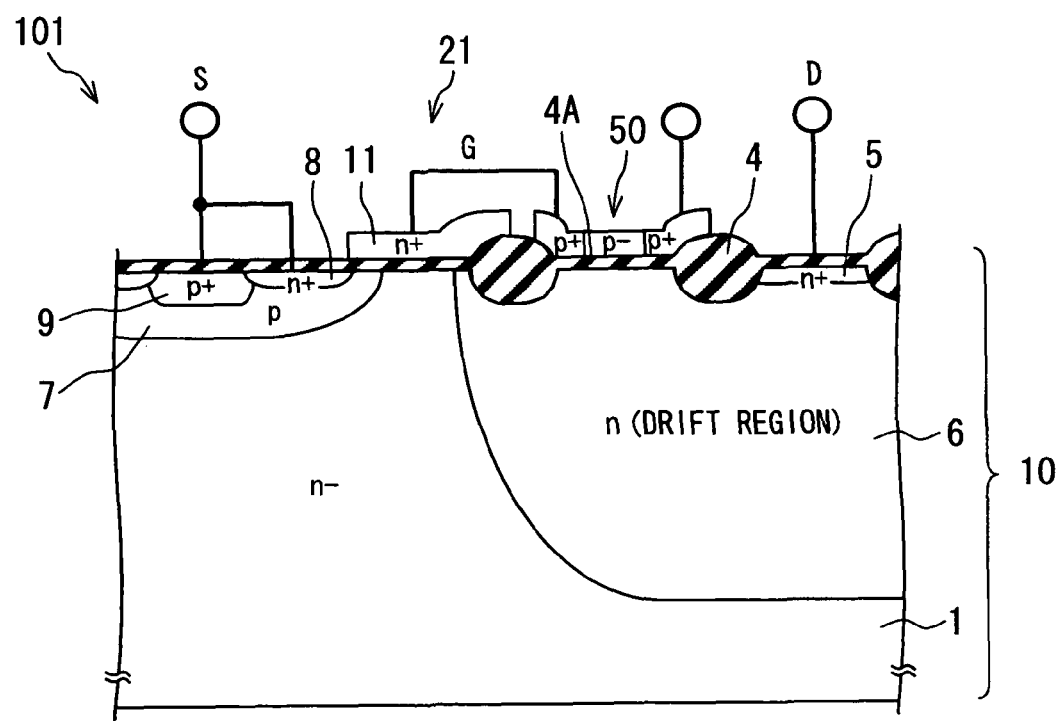
FIG. 4 is a schematic cross sectional view of a semiconductor apparatus according to a first modification embodiment.

A semiconductor apparatus 101 according to a first modification embodiment is described below with reference to FIG. 4.

In the semiconductor apparatus 101, the polycrystalline silicon resistor 50 is disposed on an insulating film 4A. The insulating film 4A is disposed on the drift region 6 of the drain of the LDMOS 21. A resistance of the polycrystalline silicon resistor 50 in the semiconductor apparatus 101 depends on the drain voltage Vd more sensitive than that in the semiconductor apparatus 100. When the LDMOS 21 is operated on low voltage, the above configuration may be effective.

A semiconductor apparatus 102 according to a second modification embodiment is described below with reference to FIGS. 5A and 5B.

Figure 5A:
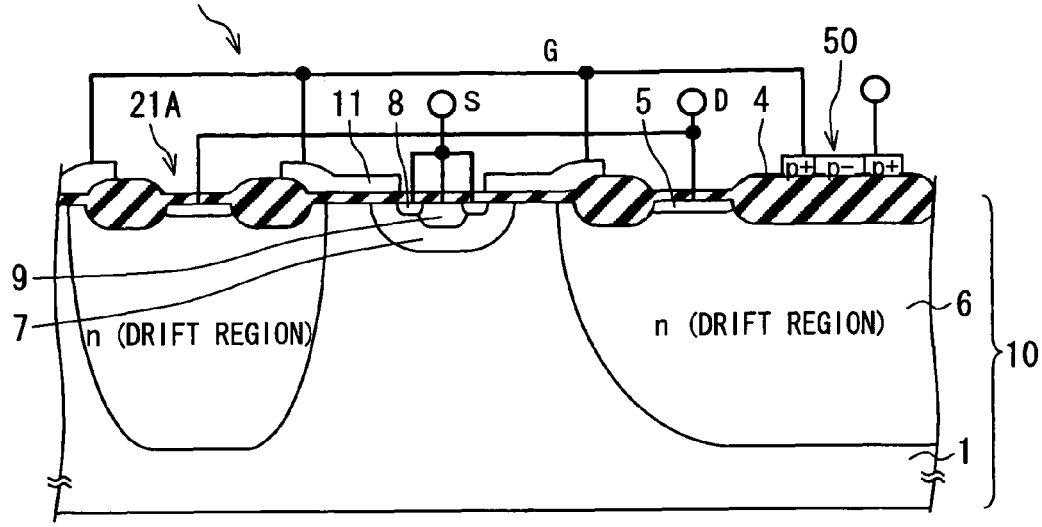
FIG. 5A is a schematic cross sectional view of a semiconductor apparatus according to a second modification embodiment, the view being taken along dashed-dot line VA-VA shown in FIG. 5B.
Figure 5B:
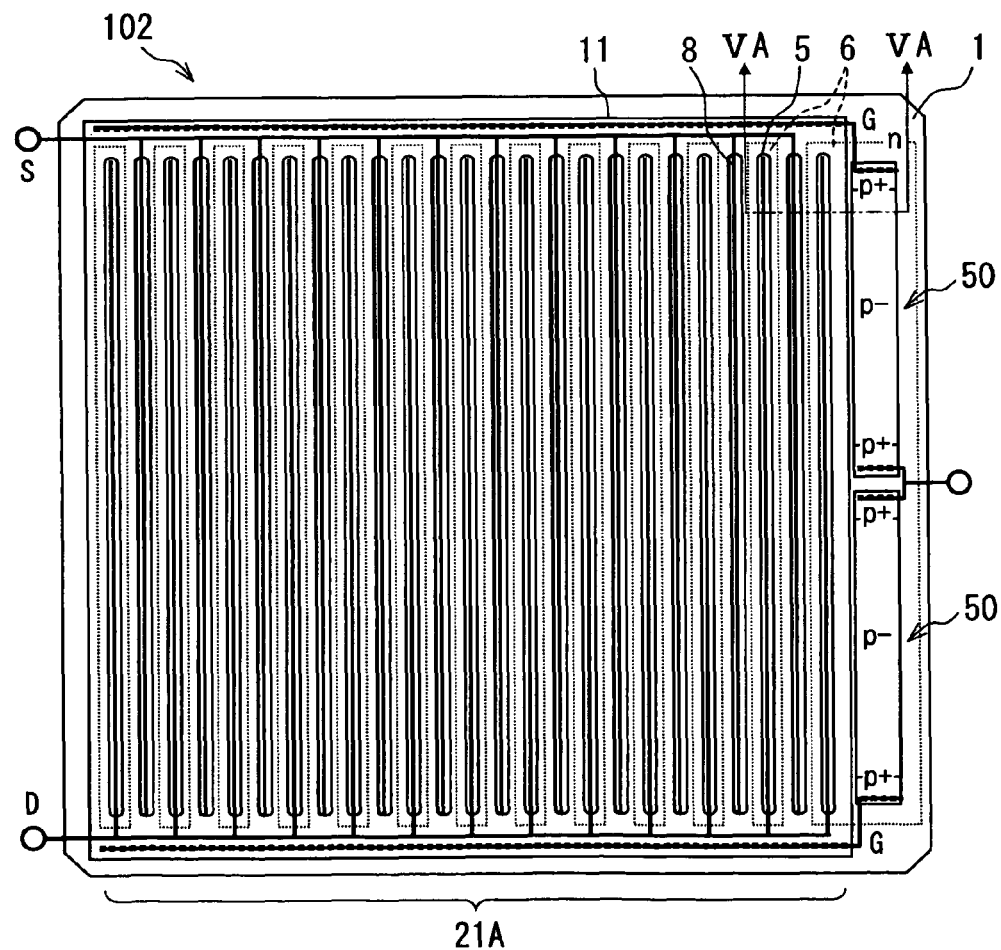
FIG. 5B is a schematic plan view illustrating a whole area of the semiconductor apparatus according to the second modification embodiment.

In the semiconductor apparatus 102, as shown in FIGS. 5A, 5B, the polycrystalline silicon resistor 50 is disposed on a part of a surface of the LOCOS oxide layer 4. The part of the surface corresponds to a periphery of an LDMOS 21A. The LDMOS 21A (i.e., a lateral type MIS transistor) is formed on the semiconductor substrate 10 (i.e., a chip). The drift region 6 of the drain is extended to an area corresponding to the periphery of the LDMOS 21A.

When a LDMOS is used as a power element, the LDMOS may include multiple cells arranged in parallel. As shown in FIG. 5B, when a chip area has sufficient space, the polycrystalline silicon resistor 50 can be arranged on the periphery of a LDMOS 21A area. Therefore, a pattern design can be simplified without changing a cell structure in the LDMOS 21A formed area. In addition, it is possible to improve arrangement degree of freedom for the polycrystalline silicon resistor 50.

In each semiconductor apparatus 100, 101, 102, the polycrystalline silicon resistor 50 is disposed on the insulating film (i.e., the LOCOS oxide layer 4 or the insulating film 4A). The insulating film is disposed on the drift region of the drain of the LDMOS 21, 21A. The drain voltage Vd is applied to the polycrystalline silicon resistor 50 via the insulating film.

A semiconductor apparatus 103 according to a third modification embodiment and semiconductor apparatus 104 according to a fourth modification embodiment are described below with reference to FIG. 6A and FIG. 6B, respectively.

Each semiconductor apparatus 103, 104 includes a wiring layer 16. The wiring layer 16 is disposed over the polycrystalline silicon resistor 50 through an interlayer insulating film 15. The wiring layer is coupled with the drain of the LDMOS 21. In each semiconductor apparatus 103, 104, the drain voltage Vd is applied to the polycrystalline silicon resistor 50 through the interlayer insulating film 15 and the wiring layer 16. The conductivity type of the polycrystalline silicon resistor 50 is opposite to that of the drain.

Figure 6A:
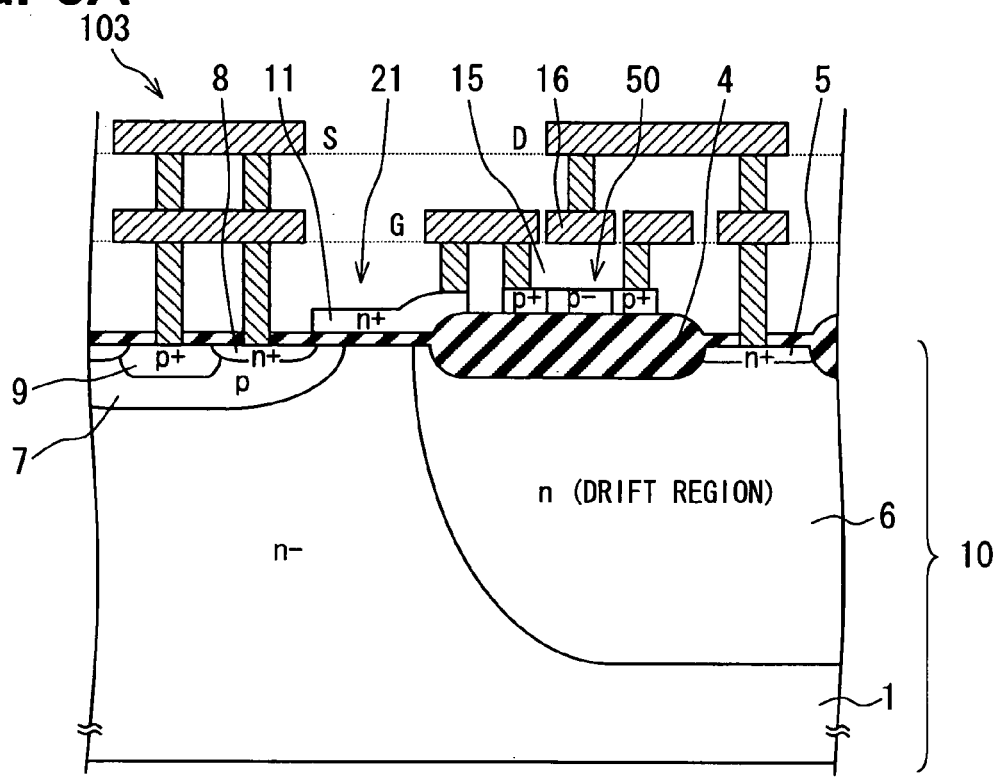
FIG. 6A is a schematic cross sectional view of a semiconductor apparatus according to a third modification embodiment.

In the semiconductor apparatus 103 shown in FIG. 6A, the polycrystalline silicon resistor 50 is disposed on the LOCOS oxide layer 4 which is formed on the drift region of the LDMOS 21. The drain voltage Vd is applied to the polycrystalline silicon resistor 50 also through the LOCOS oxide layer 4 accordingly. In the semiconductor apparatus 103 shown in FIG. 6A, the drain voltage Vd is applied from both sides of the polycrystalline silicon resistor 50, and therefore, it is possible to provide stronger drain voltage Vd dependence compared to the semiconductor apparatus 100 shown in FIG. 1.

Figure 6B:
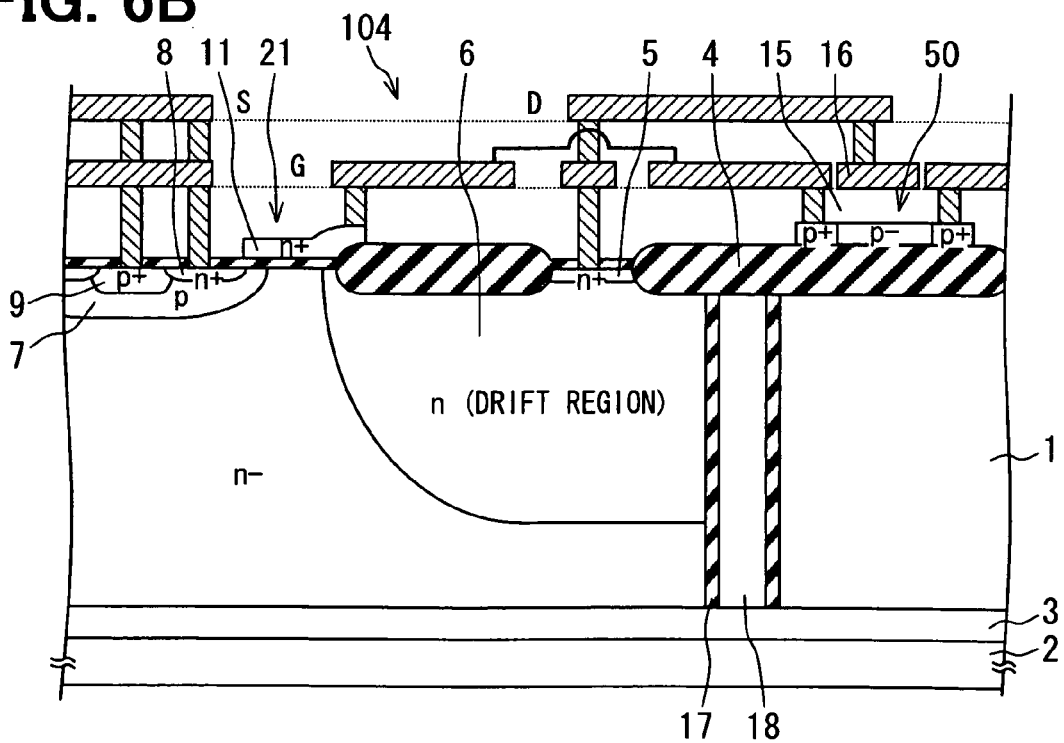
FIG. 6B is a schematic cross sectional view of a semiconductor apparatus according to a fourth modification embodiment.

The semiconductor apparatus 104 shown in FIG. 6B is formed from a semiconductor substrate having an SOI (Silicon on Insulator) structure. The semiconductor apparatus 104 includes a P type silicon substrate 2, an insulating layer 3, and an N type layer 1. An electrical separation trench electrically separates the LDMOS 21 from surrounding elements. The electrical separation trench includes a side-wall insulating layer 17 and a polycrystalline silicon 18. The polycrystalline silicon 18 is embedded in the electrical separation trench through the side-wall insulating layer 17. The polycrystalline silicon resistor 50 of the semiconductor apparatus 104 is disposed on a part of the LOCOS oxide layer 4, the part being disposed outside of the electrical separation trench. The drain voltage Vd is applied almost only through the wiring layer 16. The wiring layer 16 connects the interlayer insulating film 15 and the drain of the LDMOS 21.

The semiconductor apparatuses 103, 104 shown in FIGS. 6A, 6B have simple structure, and are capable of being manufactured at low cost.

A semiconductor apparatus 105 according to a fifth modification embodiment is described below with reference to FIGS. 7A, 7B, 7C.

Figure 7A:
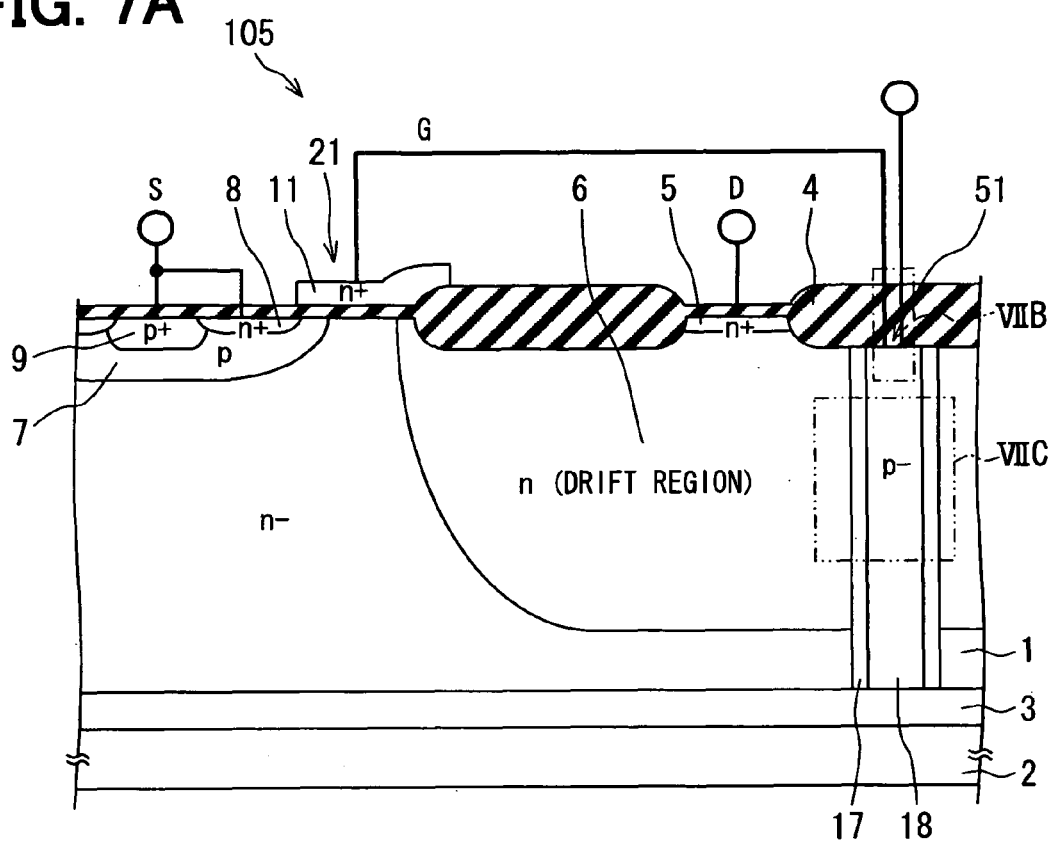
FIG. 7A is a schematic cross sectional view of a semiconductor apparatus according to a fifth modification embodiment.
Figure 7B:
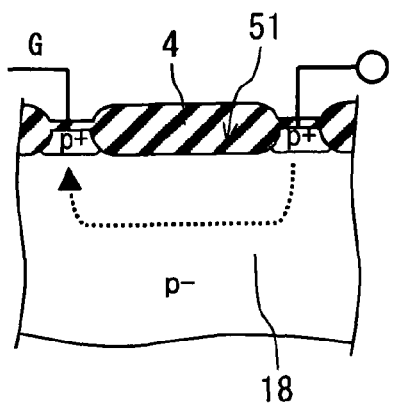
FIG. 7B is an enlarged view of an area surrounded by a dashed-dot line VIIB described in FIG. 7A.
Figure 7C:
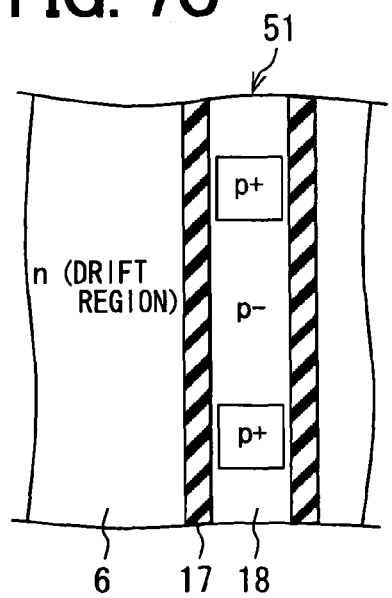
FIG. 7C is an enlarged view of an area VIIC surrounded by a dashed-two dot line described in FIG. 7A.

In the semiconductor apparatus 105 shown in FIGS. 7A, 7B, 7C, the polycrystalline silicon 18 has low concentration (with respect to p−) and is embedded in the electrical separation trench through the side-wall insulating layer 17. The polycrystalline silicon 18 of the semiconductor apparatus 105 provides a polycrystalline silicon resistor 51. The polycrystalline silicon resistor 51 functions as the polycrystalline silicon resistor 50 of the semiconductor apparatuses 100-104 shown in FIGS. 1-6. In the semiconductor apparatus 105, the polycrystalline silicon 18 is provided in the line for the gate drive signal of the LDMOS transistor 21. The conductivity type of the polycrystalline silicon resistor 51 is opposite to that of the drain of the LDMOS transistor 21. The drain voltage Vd of the drift region 6 of the LDMOS transistor 21 is applied to the polycrystalline silicon resistor 51 of the polycrystalline silicon 18 through the side-wall insulating layer 17. In the semiconductor apparatus 105, the overshoot of the drain voltage Vd (i.e., surge voltage) is reduced, and the noise and the switching loss are suppressed.

Since the polycrystalline silicon resistor 51 is disposed in the trench, the increase in a chip area associated with the existence of the polycrystalline silicon resistor 51 is also suppressed.

In each semiconductor apparatus 100-105 shown in FIGS. 1-7, the polycrystalline silicon resistor 50, 51 is connected with the gate electrode 11 by a line. The gate electrode 11 is provided by a part of polycrystalline silicon in the LDMOS 21. Alternatively, the polycrystalline silicon resistor 50, 51 and the gate electrode 11 of the LDMOS 21 may integrally formed since the polycrystalline silicon resistor 50, 51 and the gate electrode 11 of the LDMOS 21 are provided by a same polycrystalline silicon.

Semiconductor apparatuses 106-108 are described below. In each semiconductor apparatus 106-108, the polycrystalline silicon resistor and the gate electrode of the LDMOS are combined.

Figure 8:
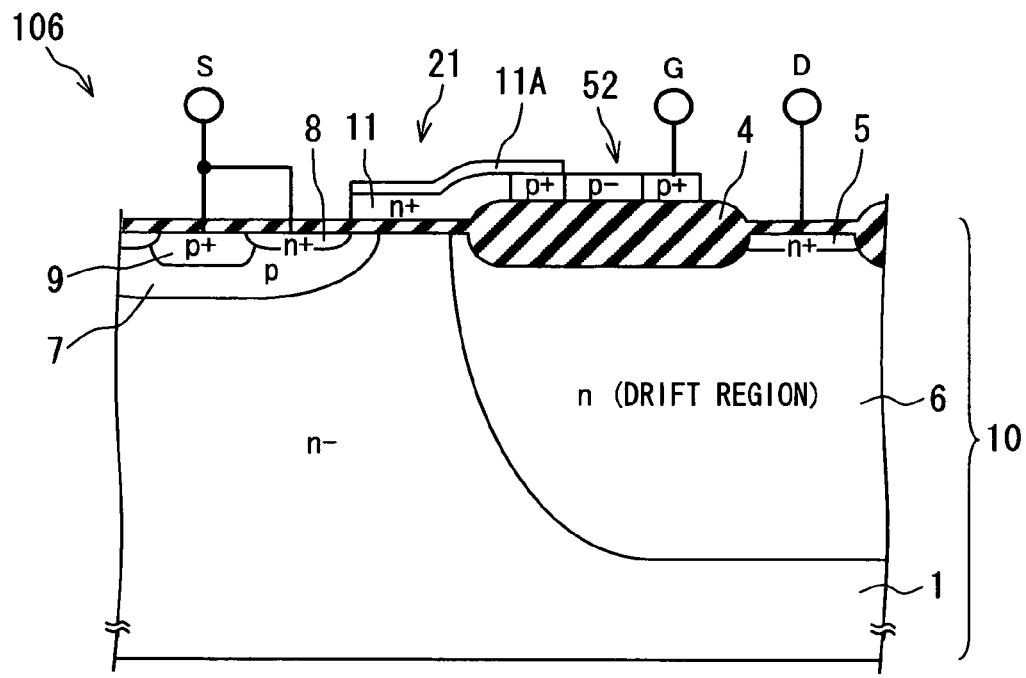
FIG. 8 is a schematic cross sectional view of a semiconductor apparatus according to a sixth modification embodiment.

The semiconductor apparatus 106 according to a sixth modification embodiment is described below with reference to FIG. 8. The conductivity type of a polycrystalline silicon resistor 52 is different from that of the gate electrode 11 in order to control a threshold voltage of the LDMOS 21. Ion-implantation forms regions in the integrally formed gate electrode and the polycrystalline silicon resistor. The ion-implanted regions formed in the gate electrode and the polycrystalline silicon resistor may have different conductivity type and different impurity concentration from each other, resulting from different impurities implantation. When, similar to the semiconductor apparatus 106, the conductivity type of the gate electrode is different from that of the polycrystalline silicon resistor, it may be preferable that a part of the polycrystalline silicon resistor is configured to touch the gate electrode 11 and a silicide layer 11A or a metal layer is formed. In the above manner, the silicide layer 11A shorts the part of the polycrystalline silicon resistor and the gate electrode. The gate electrode 11 is connected with the polycrystalline silicon resistor in a simple configuration even if the conductivity types are different from each other.

Figure 9:
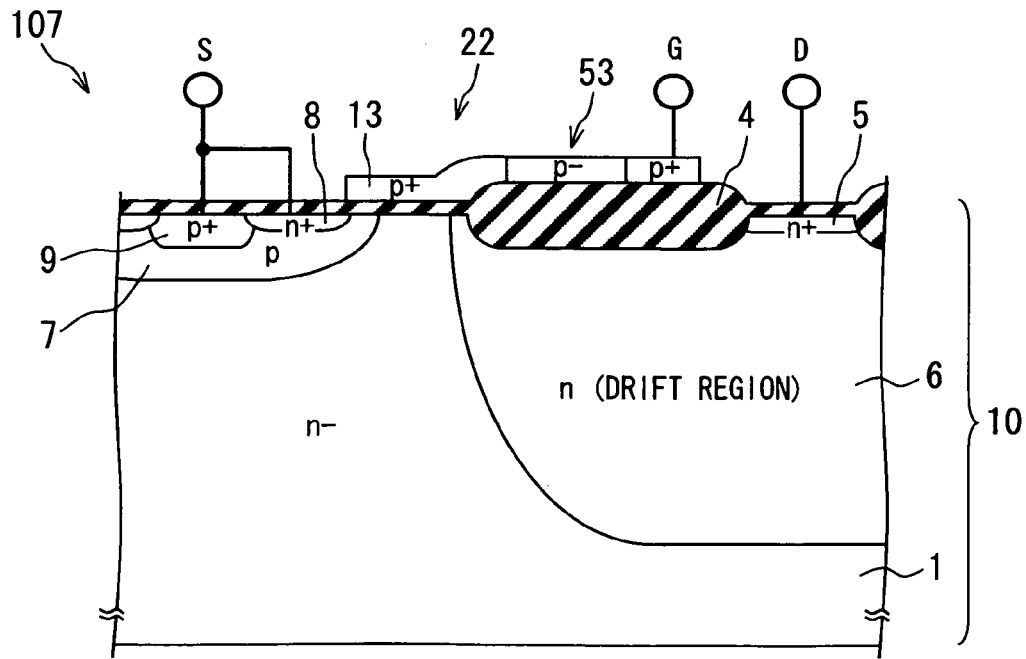
FIG. 9 is a schematic cross sectional view of a seventh modification semiconductor apparatus.

In the semiconductor apparatus 107 shown in FIG. 9 according to a seventh modification embodiment, the polycrystalline silicon resistor and a gate electrode of an LDMOS 22 (i.e., a lateral type MIS transistor) have the same conductivity type (i.e., P type). In the above case, although a threshold voltage of the LDMOS 22 increases, since a particular structure to connect between the polycrystalline silicon resistor and the gate electrode is not required, the semiconductor apparatus 107 has a simplified structure and a low manufacturing cost.

Figure 10:
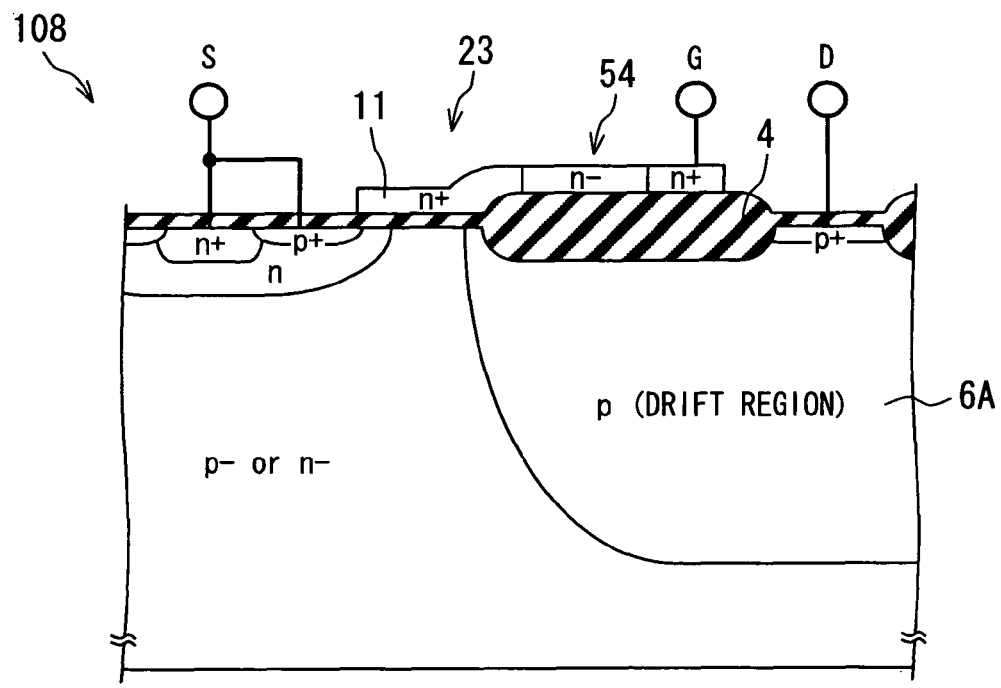
FIG. 10 is a schematic cross sectional view of a semiconductor apparatus according to an eighth modification embodiment.
Figure 11:
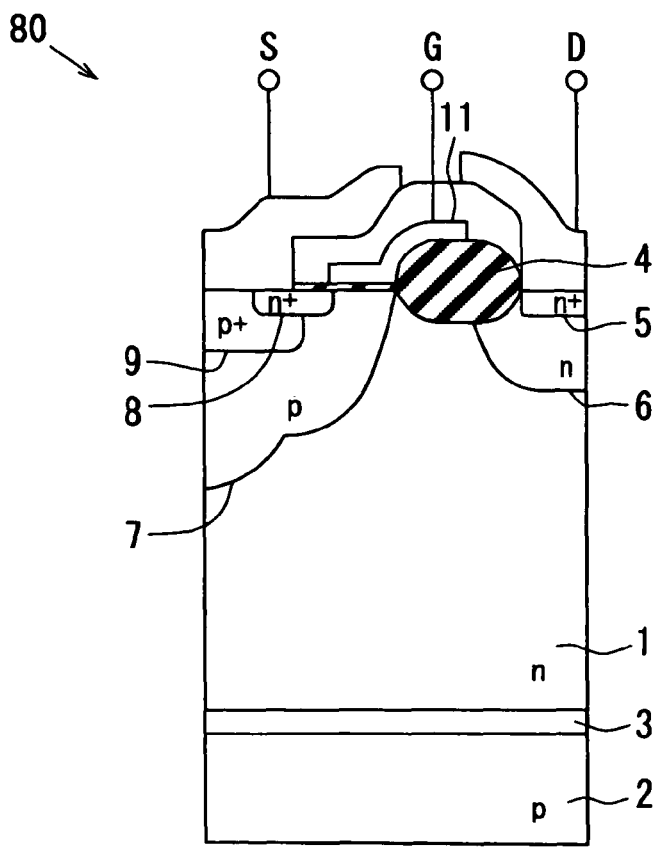
FIG. 11 is a schematic cross sectional view of a semiconductor apparatus according to the prior art.
Figure 12:
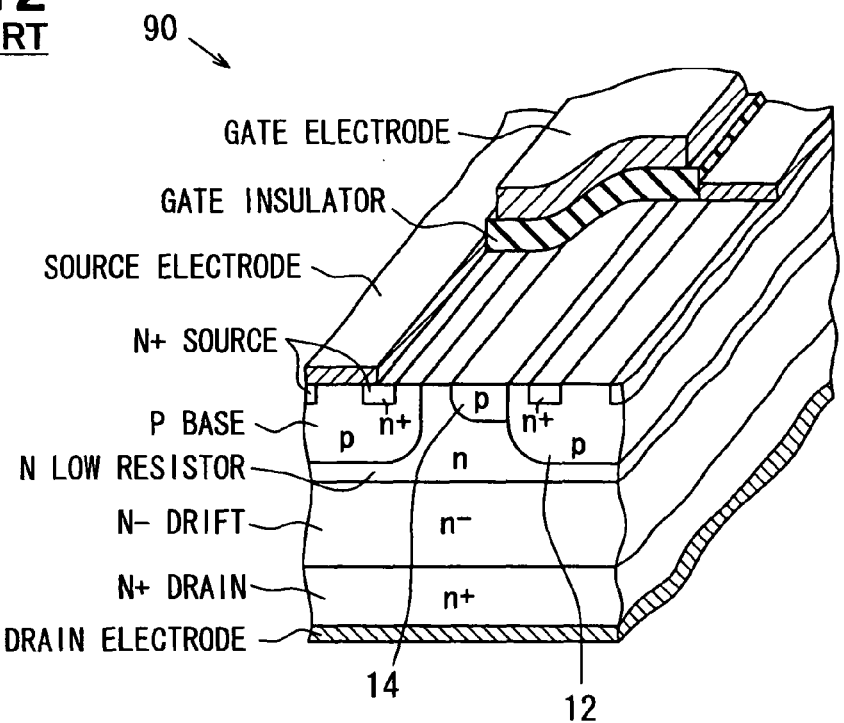
FIG. 12 is a schematic cross sectional view of a semiconductor apparatus according to the prior art.

The semiconductor apparatus 108 according to an eighth modification embodiment is described below with reference to FIG. 10. A gate electrode 11 of an LDMOS 23 (i.e., a lateral type MIS transistor) and a polycrystalline silicon resistor 54 are integrally formed from a same N conductivity type polycrystalline silicon. A conductivity type of the semiconductor apparatus 108 shown in FIG. 10 is opposite to that of the semiconductor apparatus 107 shown in FIG. 9. While the semiconductor apparatus 107 shown in FIG. 9 includes an n-channel LDMOS 23, the semiconductor apparatus 108 shown in FIG. 10 includes a p-channel LDMOS 23. In the semiconductor apparatus 108 shown in FIG. 10, the polycrystalline silicon resistor 54 is disposed on the LOCOS oxide layer 4. The LOCOS oxide layer 4 is disposed in and formed in a drift region 6A that has a P type conductivity. The drain voltage Vd of the drift region 6A of the LDMOS 23 is applied to the polycrystalline silicon resistor 54. In the semiconductor apparatus 108, since the conductivity type of the polycrystalline silicon resistor 54 is opposite to that of the drain D, the overshoot of the drain voltage Vd (i.e., surge voltage) is reduced. Furthermore, Suppressing noise (i.e., linking) and preventing the increase in the switching loss are achieved.

In each semiconductor apparatus 106-108, a line for connecting between the gate electrode 11, 13 and the polycrystalline silicon resistor 51, 53, 54 is no required. Lowering wiring efficiency due to arrangement of the polycrystalline silicon resistor 51, 53, 54 is suppressed.

Each semiconductor apparatus shown in FIGS. 1-10 includes the LDMOS transistor having a high-speed switching capability, is capable of being configured to be small size, and is capable of being manufactured at low cost. Furthermore, the overshoot of the drain voltage is reduced, and the increase in the switching loss is suppressed.

While the invention has been described with reference to preferred embodiments thereof, it is to be understood that the above-described embodiments and constructions. In addition, while the various combinations and configurations, which are preferred, other combinations and configurations, including more, less or only a single element, are also within the spirit and scope of the invention.

What is claimed is:

1. A semiconductor apparatus comprising:
   a semiconductor substrate;
   a lateral type MIS transistor that is disposed on a surface part of the semiconductor substrate;
   a line for a gate drive signal, the line connecting a gate electrode of the lateral type MIS transistor to a drive voltage production circuit;
   a polycrystalline silicon resistor that is inserted in the line so that the drive voltage production circuit, the polycrystalline silicon resistor, and the gate electrode are connected in series with each other, and that has a conductivity type opposite to a conductivity type of a drain of the lateral type MIS transistor, wherein the drain includes a drain region and a drift region; and
   an insulating layer via which the polycrystalline silicon resistor and the drain of the lateral type MIS transistor are disposed opposite to each other so that an electric potential of the drain acts on the polycrystalline silicon resistor through the insulating layer to spread a depletion layer in the polycrystalline silicon resistor, the depletion layer increasing a resistance of the polycrystalline silicon resistor between the gate electrode and the drive voltage production circuit.

2. The semiconductor apparatus according to claim 1, wherein
   the drain region is disposed on the drift region,
   the insulating layer is disposed on the drift region, and
   the polycrystalline silicon resistor is disposed on the insulating layer.

3. The semiconductor apparatus according to claim 2, wherein
   the insulating layer includes a LOCOS oxide layer.

4. The semiconductor apparatus according to claim 3, wherein
   the polycrystalline silicon resistor is disposed on a periphery of the lateral type MIS transistor.

5. The semiconductor apparatus according to claim 1, wherein
   the insulating layer provides an interlayer insulating film, and
   the interlayer insulating film is disposed over the semiconductor substrate.

6. The semiconductor apparatus according to claim 1, wherein
   the lateral type MIS transistor further includes a drift region and a trench, wherein
   the drift region is disposed in the drain,
   the trench is disposed in the drift region,
   the insulating layer is a side-wall insulating layer of the trench, and
   the polycrystalline silicon resistor is disposed on the side-wall insulating layer and disposed in the trench.

7. The semiconductor apparatus according to claim 1, wherein
   the gate electrode is made of polycrystalline silicon.

8. The semiconductor apparatus according to claim 1, wherein
   the gate electrode is made of polycrystalline silicon, and
   the gate electrode and the polycrystalline silicon resistor are integrated in the lateral type MIS transistor.

9. The semiconductor apparatus according to claim 8, further comprising:
   a silicide layer 11A disposed between the gate electrode and the polycrystalline silicon resistor, and
   a conductivity type of the polycrystalline silicon resistor is different from a conductivity type of the gate electrode.

10. The semiconductor apparatus according to claim 8, wherein
    the polycrystalline silicon resistor and the gate electrode have a same conductivity type.

11. The semiconductor apparatus according to claim 8, further comprising:
    a metal layer disposed between the gate electrode and the polycrystalline silicon resistor, and
    a conductivity type of the polycrystalline silicon resistor is different from a conductivity type of the gate electrode.

12. The semiconductor apparatus according to claim 1, wherein
    the polycrystalline silicon resistor has an impurity concentration approximately lower than $1 \times 10^{17}$ cm$^{-3}$.

13. The semiconductor apparatus according to claim 1, wherein the polycrystalline silicon resistor is a MOS resistor.

14. A semiconductor apparatus comprising:
a semiconductor substrate that has a first conductivity type;
a lateral type MIS transistor that is disposed on a surface part of the semiconductor substrate, the lateral type MIS transistor including:
  an insulating layer that is disposed on a surface of the semiconductor substrate;
  a drain that includes a drain region that has the first conductivity type, and that is disposed on the insulating layer so that the drain region is disposed in the semiconductor substrate, and a drift region that has the first conductivity type, and that is disposed in the semiconductor substrate so that the drain region is disposed between the drift region and the insulating layer;
  a gate electrode that has the first conductivity type, and that is disposed on the insulating layer;
  a polycrystalline silicon resistor that has a second conductivity type, and that is disposed on the insulating layer so that the insulating layer is disposed between the polycrystalline silicon resistor and the drift region;
  a source region that has the first conductivity type, and that is disposed on the insulating layer so that the source region is disposed in the semiconductor substrate; and
  a contact region that has the second conductivity type, and that is disposed on the insulating layer and adjacent to the source region; and
  a line for a gate drive signal, the line connecting the gate electrode to a drive voltage production circuit through the polycrystalline silicon resistor so that the drive voltage production circuit, the polycrystalline silicon resistor, and the gate electrode are connected in series with each other, wherein
the first conductivity type is opposite to the second conductivity type,
the polycrystalline silicon resistor has an impurity concentration approximately lower than $1 \times 10^{17}$ cm$^{-3}$, and
the drain and the polycrystalline silicon resistor are disposed on opposite sides of the insulating layer so that an electric potential of the drain acts on the polycrystalline silicon resistor through the insulating layer to spread a depletion layer in the polycrystalline silicon resistor, the depletion layer increasing a resistance of the polycrystalline silicon resistor between the gate electrode and the drive voltage production circuit.

15. The semiconductor apparatus according to claim 14, wherein the polycrystalline silicon resistor is a MOS resistor.

* * * * *